(12) United States Patent
Kuo et al.

(10) Patent No.: US 6,483,352 B1
(45) Date of Patent: Nov. 19, 2002

(54) CURRENT MIRROR SENSE AMPLIFIER

(75) Inventors: Sheng-Chang Kuo, Miao-Li (TW); Ti-Wen Chen, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/047,612

(22) Filed: Jan. 14, 2002

(30) Foreign Application Priority Data

Sep. 24, 2001 (TW) ........................................ 90123429 A

(51) Int. Cl.[7] .................................................. G11C 7/06
(52) U.S. Cl. ........................................... 327/53; 327/51
(58) Field of Search ...................... 327/51–55; 323/315; 365/210

(56) References Cited

U.S. PATENT DOCUMENTS 5,355,038 A * 10/1994 Hui ............................. 327/276
5,369,614 A * 11/1994 Miyanishi ............... 365/189.01
5,929,658 A * 7/1999 Cheung et al. ................ 327/53
5,986,937 A * 11/1999 Yero ........................ 365/185.2
6,141,246 A * 10/2000 Derman et al. ................ 327/51
6,362,661 B1 * 3/2002 Park ............................. 327/53

* cited by examiner

*Primary Examiner*—Toan Tran
(74) *Attorney, Agent, or Firm*—J.C. Patents

(57) ABSTRACT

A current mirror sense amplifier, with a two-stage current mirror, a first transistor, and a second transistor. The first transistor and the second transistor each have first and second connection terminals. The current mirror has a current input terminal and a current output terminal. The first transistor has a gate electrically connected to a pre-charge voltage. The first connection terminal of the first transistor is electrically connected to a reference voltage. The second transistor has a gate electrically connected to a reference signal. The first connection terminal of the second transistor is electrically connected to the reference voltage. The second connection terminals are connected to the current output terminal in parallel.

6 Claims, 3 Drawing Sheets

CURRENT MIRROR SENSE AMPLIFIER

CROSS-REFERENCE TO RELATED APPLICATION

This application claims the priority benefit of Taiwan application Ser. No. 90123429, filed Sep. 24, 2001.

BACKGROUND OF THE INVENTION

1. Field of the Invention

The invention relates in general to a sense amplifier, and more particularly, to a current mirror sense amplifier.

2. Description of the Related Art

In the conventional sense amplifier structure, a differential amplifier is used for comparison to obtain data 1 or data 0. However, in the sense process, a sufficient time span has to be reserved for the first section, the pre-charge time. When a bit line overcharge occurs in the pre-charging process or a weak pre-charge is used, the detection of data 1 becomes slow, and the pre-charge process takes much time for pre-charging bit lines. To increase the speed of data transient without being affected by noise, one has to alter the pre-charge control.

FIG. 1 shows a conventional first type sense amplifier. The operation method of the conventional sense amplifier uses a first transistor 112 as a diode to convert a current of a selected memory cell into its corresponding voltage (VC). Using a differential amplifier, the corresponding voltage VC is compared to a reference voltage VREF to obtain the data 0 and 1.

However, a sense amplifier requires 1 differential amplifier, and Each of 2–8 sense amplifiers need a reference voltage generator such that a larger current is utilized and die size becomes relatively large. Plus, because the variation of the corresponding voltage (VC) is smaller, the noise margin of data 0 and 1 is poor.

Therefore, a second type sense amplifier that does not require a differential amplifier has been developed. The second type sense amplifier is smaller in circuit design. Referring to FIG. 2, it uses a clock signal CK1 for pre-charge, so that N1 can be pre-charged to the level of data 0. When the clock signal CK1 becomes high level, the data level can be obtained at N1 according to the discharge result of the bit line. The inverter 234 is used as a delay for bit line discharge. Passing through the delay 234, the data is stored by the latch 235 formed of the inverters 222 and 223.

This kind of amplifier still has a lot of problems. For example, the speed for converting data 0 to 1 is determined by the speed for the N1 node of the selected memory cell discharging a current, and thus the current of the N1 node becomes in a state of a low level. Therefore, it is not suitable for high speed apparatus, and during a pre-charge cycle, a strong pre-charge efficiency causes a bit line to overshoot; a weak pre-charge efficiency causes failure of data access.

According to the above, in the conventional sense amplifier, the speed of data access is affected by the pre-charge time.

SUMMARY OF THE INVENTION

The invention provides a sense amplifier that does not have to reserve a pre-charge time span. Such a sense amplifier is not affected by the pre-charge time, so that the data can be applied to high-speed transient apparatus.

The invention provides a current mirror sense amplifier including a two stage current mirror, a first transistor and a second transistor.

The first and second transistors each have a first and second connection terminal. The first transistor has a gate electrically connected to a pre-charge voltage. The first connection terminal of the first transistor is electrically connected to a power source. A gate of the second transistor is electrically connected to a reference signal. The first connection terminal of the second transistor is electrically connected to the above power source. The first connection terminals of the first and the second transistors are connected to the current output terminal of the two-stage current mirror in parallel.

In one embodiment of the invention, the two-stage current mirror comprises a third transistor, a fourth transistor, a fifth transistor and a sixth transistor. The third transistor has a gate, a first connection terminal and a second connection terminal. The first connection terminal of the third transistor is coupled to the power source. The fourth transistor has a gate, a first connection terminal and a second connection terminal. The first connection terminal of the fourth transistor is coupled to the power source. The fifth transistor has a gate, a first connection terminal and a second connection terminal. The first connection terminal of the fifth transistor is coupled to ground. The sixth transistor has a gate, a first connection terminal and a second connection terminal. The first connection terminal of the sixth transistor is coupled to ground.

The gate and the second connection terminal of the third transistor, and the gate of the fourth transistor are coupled to one node, which is the current input terminal of the two-stage current mirror. The second connections of the fourth and fifth transistors, and the gates of the fifth and sixth transistor are coupled to a node. The second connection terminal of the sixth transistor is the current output terminal of the two-stage current mirror.

The third transistor and the fourth transistor construct a first stage current mirror, while the fifth and sixth transistors construct a second stage current mirror.

When the current mirror starts sensing current, the current enters from the current input terminal of the current mirror. By changing the width-length ratio (W/L) of the second transistor, the current ratio between the output terminal of the current mirror and the second connection terminal of the second transistor is changed. That is, the current ratio between the second connection terminal of the sixth transistor and the second connection terminal of the second transistor is changed. After being sensed, the first transistor provides a current to the current output terminal of the current mirror to change the level thereof The two-stage current mirror of the sense amplifier steadily amplifies the current input from the current input terminal at the current output terminal. A set of parallel connected transistors in the amplifier prevents the voltage at the output terminal from dropping too low due to pre-charging current during the sense process of the current mirror. The effect caused by noise can also be suppressed.

In addition, the loading of the output terminal is far less than that of the input terminal. Therefore, the charge/discharge speed at the output terminal is much faster than that of the input terminal. As a result, the data access speed at the output terminal is not slowed down due to the loading of the input terminal.

According to the above, the invention uses a two-stage current mirror for the data level sense. The current from input terminal is steadily amplified via the two-level current mirror. Using a set of parallel connected transistors, a level is provided to compensate the voltage drop at the output terminal caused by pre-charging current during the sense process of the amplifier. Thus, the data can be steadily applied to a high transient speed apparatus without being affected by pre-charging time.

Both the foregoing general description and the following detailed description are exemplary and explanatory only and are not restrictive of the invention, as claimed.

DESCRIPTION OF THE PREFERRED EMBODIMENTS

The invention uses a set of parallel transistors to compensate for the voltage drop at the output terminal of the current mirror caused by pre-charging current. Thereby, the data access and transient becomes faster and more stable.

Figure 1:
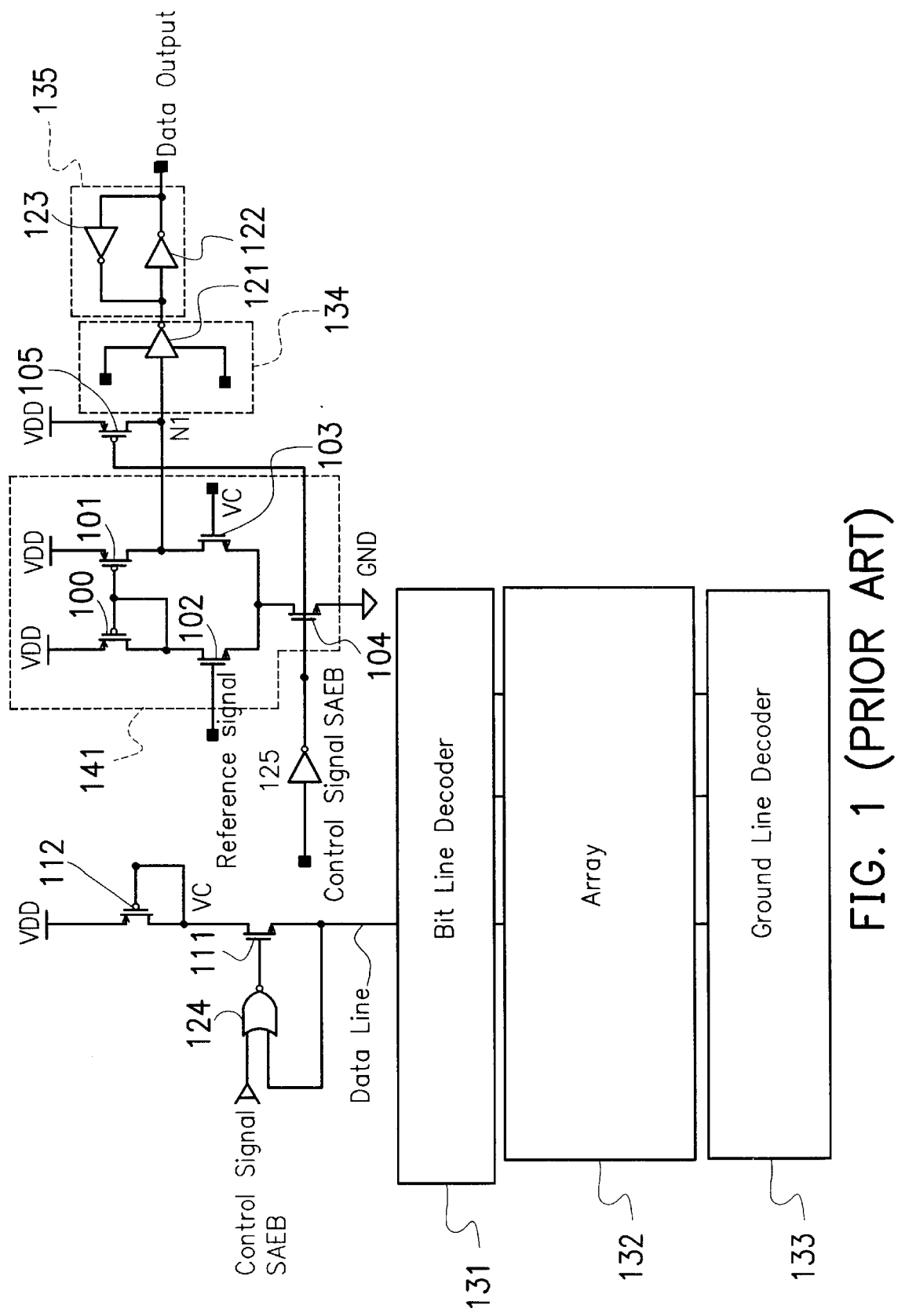
FIG. 1 shows a block diagram of the conventional first type sense amplifier and a part of the internal circuit.
Figure 2:
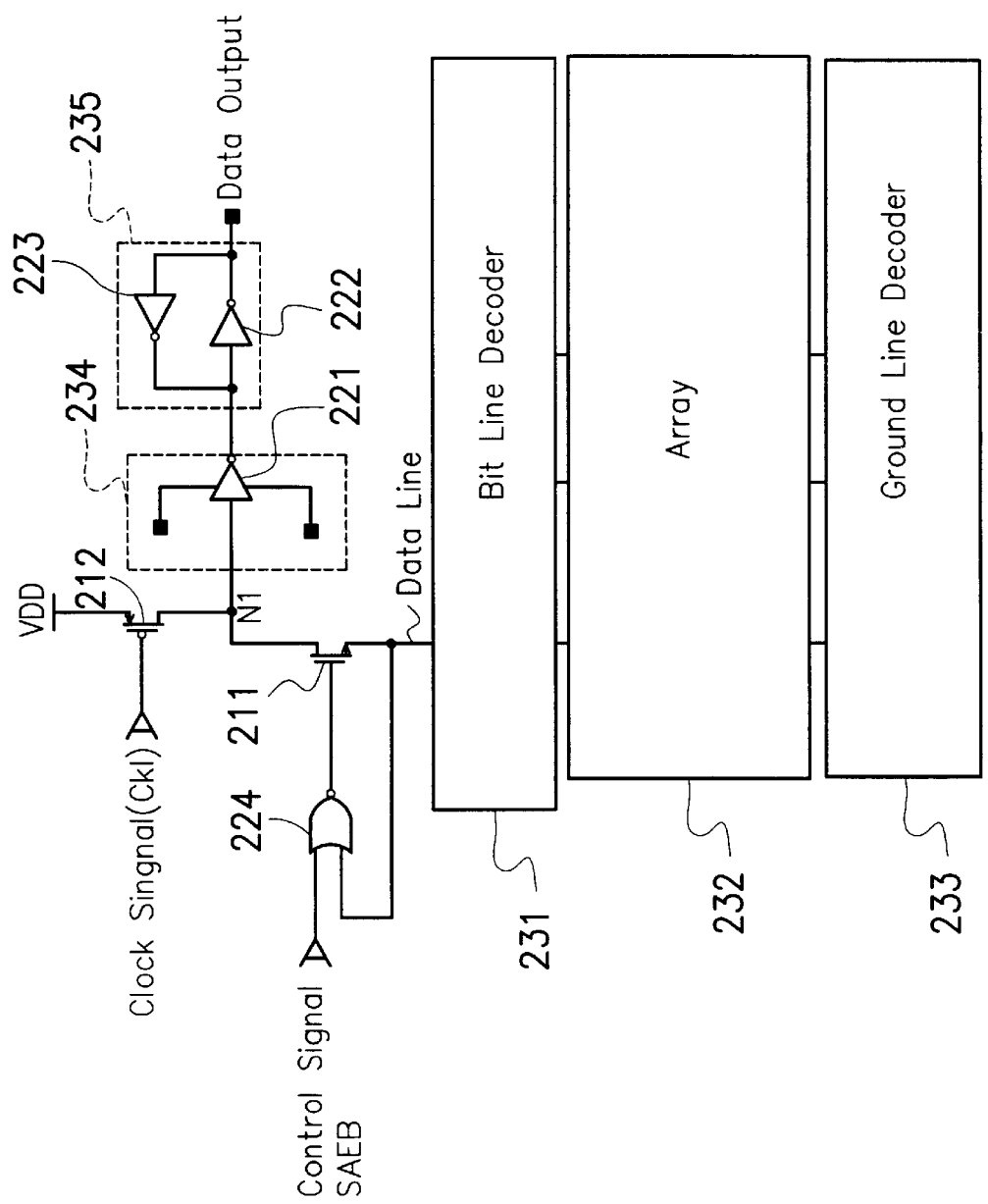
FIG. 2 shows a block diagram of the conventional second type sense amplifier and a part of the internal circuit.
Figure 3:
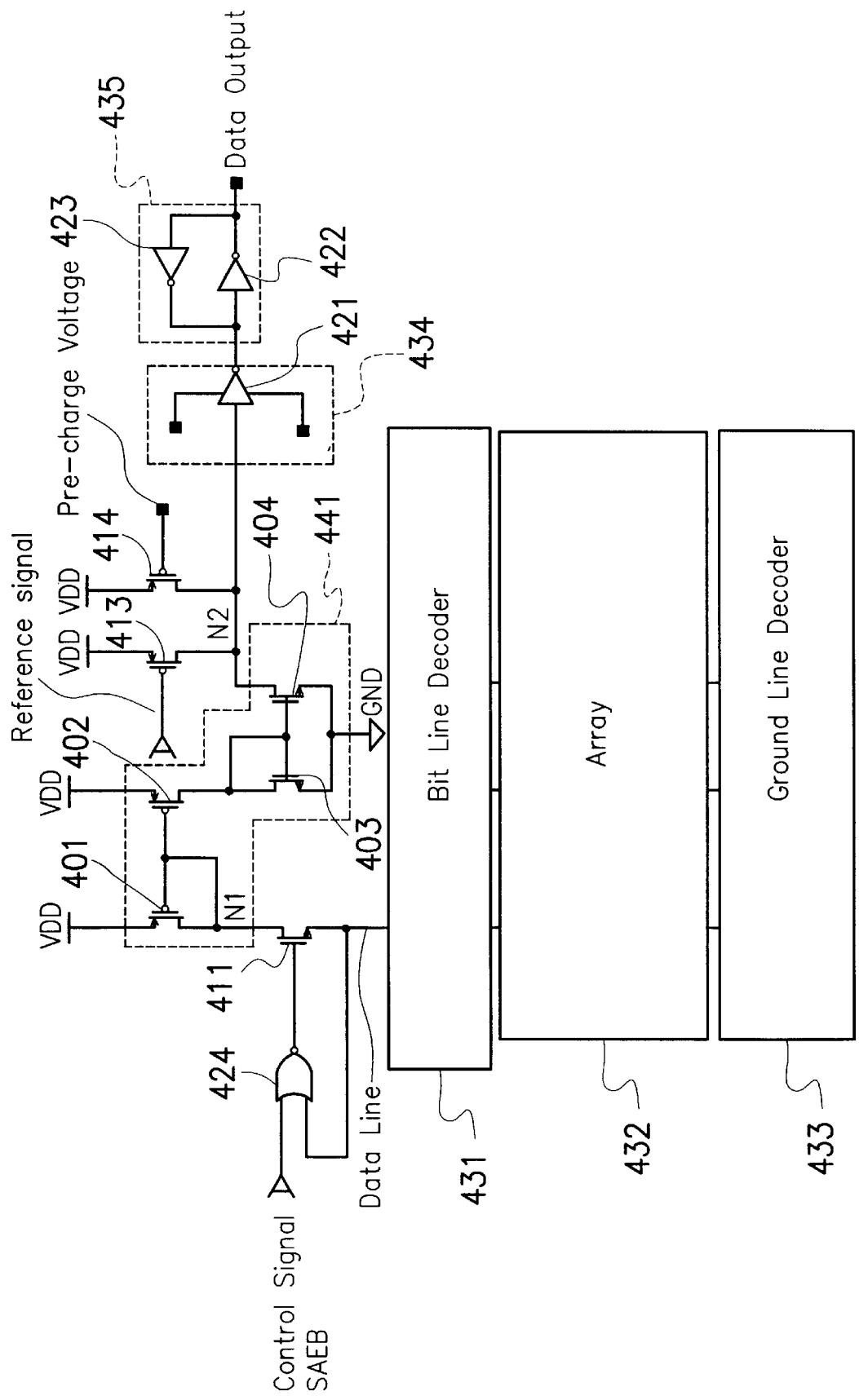
FIG. 3 shows a block diagram of the sense amplifier provided by the invention and a part of the internal circuit.

FIG. 3 shows a block diagram of the sense amplifier and an internal circuit provided by the invention.

In this embodiment, transistors 401–404 are used as a two-stage current mirror. A set of parallel transistors 413, 414 is added to construct a current mirror sense amplifier.

The transistors 401 and 402 are used as a first stage current mirror, while the transistors 403 and 404 are used as a second stage current mirror. A second connection terminal of the transistor 401 is the current input terminal of the two-stage current mirror, and a second connection terminal of the transistor 404 is the current output terminal of the two-stage current mirror.

The parallel transistors (the first transistor 414 and the second transistor 413) each have a first connection terminal and a second connection terminal. The gate of the first transistor 414 is electrically connected to a pre-charge voltage. The first connection terminal of the transistor 414 is coupled to a reference voltage. The gate of the second transistor 413 is electrically connected to a power source. The first connection terminal of the transistor 413 is electrically connected to the power source. The second connection terminals of the first and second transistors 414 and 413 are connected to the current output terminal N2 in parallel.

The input terminal N1 of the sensor is coupled to a transistor 411, which is controlled by a control signal SAEB. The transistor 411 is connected to a data line DL, and the data line DL is connected to a bit line (BL) decoder 431, an array 432 and a ground line (GL) decoder 433. The output terminal of the sensor is coupled to a delay (DEL) 434, and the delay 434 is further coupled to two inverters 422, 423 as the data storage 435.

The circuit flow can be realized from FIG. 3. The transistor 411 is a gate of the sense amplifier, while the control signal SAEB is a switch of the sense amplifier. When the control signal SAEB is low, the sense amplifier is on. A bit line is connected to the data line to determine a sense current of the selected memory cell. The current is sensed at N1 by the current mirror. A sense current is formed when the current flows through the current mirror. When the delay 434 is high, the data is saved.

When there is no problem for detection or sense of data at N1, the potential variation at N2 will be observed as follows. The operation of transistor 413 reflects the variation of a cell current. When a current provided by the transistor 413 is larger than a required current of the transistor 404, a potential of N2 rises up to a predetermined value. However, when a required current of the transistor 404 is larger than a current provided by the transistor 413, a potential of N2 declines to a predetermined value. During the sense process, the potential of N2 is varied according to the current relationship between the transistors 413 and 404.

When the data line is selected to connect with the bit line and the ground line, due to parasitic capacitance from a bit line to a GND line, the bit line is coupled temporarily, leading to affecting the sense speed.

Therefore, if a pre-charge circuit is applied to N1 for avoiding bit line coupling, dimensions of a device are difficult to be designed. With too large current, the parasitic capacitor will be overcharged, which thus relatively long time is taken to discharge for data "1". In the sense process of the conventional sense amplifier, there is always a pre-charge current that causes a great fluctuation of potential. Therefore, a pre-charge time margin has to be reserved. In the present invention, we use the transistor 414 to compensate a temporary circuit caused by bit line coupling at N2.

When accessing data has to be in a state of a high potential, at N2 with a low potential, the low potential at N2 has to be charged up to a high potential. The charging time is the pre-charge time margin that determines the data access speed.

To avoid reserving the pre-charge time margin, the width-length (W/L) ratio of the transistors 413 is altered to change the current ratio between output terminal N2 of the current mirror and the second connection terminal of the transistor 413. The gate of the transistor is connected to a pre-charge voltage VPRE which is controlled by time. A current is provided to N2 from the second connection terminal of the transistor 414, so that when a pre-charge process or bit line coupling happens, the voltage will not drop too much. The loading of N2 is much smaller than that of N1, and there is no overshoot or undershoot issue at N2. In addition, the charge/discharge speed of N2 by the transistors 413 and 404 is much faster than that of N1. Consequently, the data access is not affected by the pre-charge time.

According to above, the invention has the advantage of having a control circuit that does not have to reserve the pre-charge time margin, and therefore, the data transmission is more stable and faster.

Other embodiments of the invention will appear to those skilled in the art from consideration of the specification and practice of the invention disclosed herein. It is intended that the specification and examples are to be considered as exemplary only, with a true scope and spirit of the invention being indicated by the following claims.

What is claimed is:

1. A current mirror sense amplifier comprising:
   a two-stage current mirror, with an input terminal and an output terminal;
   a first transistor, with a gate, a first connection terminal and a second connection terminal, the gate being electrically connected to a pre-charge voltage, and the first connection terminal being electrically connected to a power source; and
   a second transistor, with a gate, a first connection terminal and a second connection terminal, the gate being electrically connected to a reference signal, and the first connection terminal being electrically connected to the power source;

wherein the second connection terminals of the first and second transistors are connected to the output terminal of the two-stage current mirror.

2. The current mirror sense amplifier according to claim 1, wherein the length-width ratio of the second transistor is altered to change a current ratio between the output terminal of the two-stage current mirror and the second connection terminal of the second transistor.

3. The current mirror sense amplifier according to claim 1, wherein the two-stage current mirror comprises:

a third transistor, with a gate, a first connection terminal and a second connection terminal, the first connection terminal being coupled to the power source;

a fourth transistor, with a gate, a first connection terminal and a second connection terminal, the first connection terminal being coupled to the power source;

a fifth transistor, with a gate, a first connection terminal and a second connection terminal, the first connection terminal being coupled to ground; and a sixth transistor, with a gate, a first connection terminal and a second connection terminal, the first connection terminal being coupled to ground;

wherein the gate of the third transistor, the second connection terminal of the third transistor and the gate of the fourth transistor are coupled to one node that is the current input terminal of the two-stage current mirror, and the second connection terminal of the fourth transistor, the second connection terminal of the fifth transistor, the gate of the fifth transistor, and the gate of the sixth transistor are coupled to one node that is the current output terminal of the two-stage current mirror, and the third and fourth transistors construct a first stage current mirror, and the fifth and sixth transistors construct a second stage current mirror.

4. The current mirror sense amplifier according to claim 3, wherein the length-width ratio of the second transistor is altered to change a current ratio between the output terminal of the two-stage current mirror and the second connection terminal of the second transistor.

5. The current mirror sense amplifier according to claim 4, wherein the current ratio between the output terminal of the two-stage current mirror and the second connection terminal of the second transistor is a current ratio between the second connection terminal of the sixth transistor and the second connection terminal of the second transistor.

6. The current mirror sense amplifier according to claim 3, wherein the length-width ratio of the third, forth, fifth or sixth transistor is altered to change a current ratio between the output terminal of the two-stage current mirror and the second connection terminal of the second transistor.

* * * * *